(12) United States Patent
Kim et al.

(10) Patent No.: US 7,446,579 B2
(45) Date of Patent: Nov. 4, 2008

(54) SEMICONDUCTOR MEMORY DEVICE HAVING DELAY LOCKED LOOP

(75) Inventors: Kyoung-Nam Kim, Kyoungki-do (KR); Ho-Youb Cho, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 207 days.

(21) Appl. No.: 11/477,530

(22) Filed: Jun. 30, 2006

(65) Prior Publication Data
US 2007/0069774 A1   Mar. 29, 2007

(30) Foreign Application Priority Data
Sep. 28, 2005   (KR)  ............ 10-2005-0090861
Dec. 29, 2005   (KR)  ............ 10-2005-0134013

(51) Int. Cl.
*H03L 7/06*   (2006.01)
(52) U.S. Cl. ............... 327/158; 365/233.11
(58) Field of Classification Search ............... None
See application file for complete search history.

(56) References Cited

U.S. PATENT DOCUMENTS

| 6,492,852 | B2 * | 12/2002 | Fiscus ............... 327/158 |
| 6,525,988 | B2 | 2/2003 | Ryu et al. |
| 6,678,206 | B2 | 1/2004 | Chu et al. |
| 6,836,437 | B2 | 12/2004 | Li et al. |
| 6,987,699 | B2 * | 1/2006 | Lee ............... 365/194 |
| 7,139,210 | B2 * | 11/2006 | Kwack et al. ............ 365/189.08 |
| 2004/0222828 | A1 * | 11/2004 | Ishikawa ............ 327/156 |
| 2005/0242853 | A1 | 11/2005 | Kwack et al. |

FOREIGN PATENT DOCUMENTS

| JP | 2004-110906 | 4/2004 |
| JP | 2004-327008 | 11/2004 |

* cited by examiner

*Primary Examiner*—Cassandra Cox
(74) *Attorney, Agent, or Firm*—McDermott Will & Emery LLP

(57) ABSTRACT

A semiconductor memory device has a delay locked loop (DLL) with low power consumption. The semiconductor memory device includes a DLL for receiving an external clock to generate a DLL clock, an idle detector for detecting an idle state in which a command for driving a device is not supplied, and an output controller for controlling the output of the DLL through the idle state whether or not data is output.

50 Claims, 10 Drawing Sheets

SEMICONDUCTOR MEMORY DEVICE HAVING DELAY LOCKED LOOP

FIELD OF THE INVENTION

The present invention relates to semiconductor design technology; and, more particularly, to a delay locked loop with low power consumption.

DESCRIPTION OF RELATED ART

A various attempts have been made to reduce power consumption in synchronous DRAMs. A typical method is to turn off a delay locked loop (DLL) which generates a DLL clock for synchronizing blocks in a semiconductor memory device. A virtue of this method is that it is possible to reduce power consumption in predetermined blocks receiving the DLL clock as well as the power consumption of the DLL itself.

The DLL clock RCLKDLL and FCLKDLL of the DLL is a clock generated in consideration of the delay due to internal elements such that output data can be synchronized with edges of the external clock EXTCLK. The DLL generates a rising DLL clock RCLKDLL, which is in phase with the external clock EXTCLK, and a falling DLL clock FCLKDLL, which is out of phase with the external clock EXTCLK, in order to output data in synchronization with rising and falling edges of the external clock EXTCLK, respectively. Thus, the semiconductor memory device outputs the data in synchronization with rising edges of the rising and falling DL clocks RCLKDLL and FCLKDLL.

The conventional DLL with low power consumption will be more fully illustrated with reference to accompanying drawings.

FIG. 1 is a block diagram of a conventional DLL device.

Referring to FIG. 1, the conventional DLL includes a DLL 10 for receiving an external clock EXTCLK to generate DLL clocks RCLKDLL and FCLKDLL, an idle detector 20 for detecting an idle state, i.e., a precharge state of a memory bank in a semiconductor memory device, and an output controller 30 for controlling the output of the DLL 10 when the output signal of the idle detector 20 is activated and a write operation is performed.

FIG. 2 is a circuit diagram setting forth the idle detector 20 of FIG. 1.

Referring to FIG. 2, the idle detector 20 includes a first delay unit 22 for delaying an idle state signal RASIDLE by a first predetermined delay time when the idle state signal RASIDLE is deactivated, a second delay unit 24 for delaying the idle state signal RASIDLE by a second predetermined delay time when the idle state signal RASIDLE is activated, and a signal generator 26 for generating a chip drive signal CHIPACT in response to the output signals of the first and second delay units 22 and 24.

The first delay unit 22 is configured with first and second inverters I1 and I2 for delaying the idle state signal RASIDLE and transferring the delayed idle state signal, a first delay element 22a for delaying the output signal of the second inverter I2, a NOR gate NR1 for performing a logic NOR operation on the output signal of the second inverter I2 and the output signal of the first delay element 22a, and an inverter I3 for inverting the output signal of the NOR gate NR1.

The second delay unit 24 is configured with the first and second inverters I1 and I2 for delaying the idle state signal RASIDLE and outputting the delayed idle state signal RASIDLE, and a second delay element 24a for delaying the output signal of the second inverter I2.

The signal generator 26 is configured with a NAND gate ND1 for performing logic NAND operation on the output signals of the first and second delay units 22 and 24 so as to output the chip drive signal CHIPACT.

FIG. 3 is an operational waveform diagram of the idle detector 20 depicted in FIG. 2. With reference to FIG. 3, an operation of the idle detector 20 will be set forth herebelow.

Referring to FIG. 3, the idle state signal RASIDLE is deactivated when an active signal ACT is activated. Therefore, the idle detector 20 activates the chip drive signal CHIPACT after a lapse of a delay time a of the first delay element 22a from the deactivation point of the idle state signal RASIDLE.

Thereafter, the idle state signal RASIDLE is activated when a precharge signal PCG is activated. Accordingly, the idle detector 20 deactivates the chip drive signal CHIPACT after a lapse of a delay time b of the second delay element 24a from the activation point of the idle state signal RASIDLE.

As depicted in FIG. 3, it is understood that the delay time b of the second delay element 24a, which controls the deactivation point of the chip drive signal CHIPACT is longer than the delay time a of the first delay element 22a. The reason is to secure a margin for stably completing the device operation which is still performed even after the precharge signal PCG is activated. For instance, since it takes a predetermined time inevitably to output a desired data completely in a read operation even after the precharge signal PCG is activated, the deactivation point of the chip drive signal CHIPACT should be delayed in order that the DLL clocks RCLKDLL and FCLKDLL are continuously supplied until the desired data is completely output.

FIG. 4 is a circuit diagram setting forth the output controller 30 of FIG. 3.

Referring to FIG. 4, the output controller 30 includes an inverter I4 for inverting a write drive signal WT12BWEN, a NAND gate ND2 for performing a logic NAND operation on the chip driving signal CHIPACT and the output signal of the inverter I4, and an inverter I5 for inverting the output signal of the NAND gate ND2 so as to generate an output control signal EN.

The output controller 30 deactivates the output control signal EN both in the idle state in which all banks are precharged, and in a write operation state in which the write drive signal WT12BWEN is activated. Therefore, the output controller 30 prevents the DLL 10 from outputting the DLL clocks RCLKDLL and FCLKDLL during these states.

The reason the DLL 10 is turned off when the write drive signal WT12BWEN is activated is that the DLL clocks RCLKDLL and FCLKDLL are not substantially required during the non-idle write operation state in which data is not output externally. Accordingly, the DLL clocks RCLKDLL and FCLKDLL are not output in the write operation state as well as the idle state.

Operation of the conventional DLL device of FIGS. 1 to 4 is as follows.

Since the idle state signal RASIDLE is activated in the idle state in which all the banks are not driven, i.e., precharged, the idle detector 20 and the output controller 30 deactivate the output control signal EN so that the DLL 10 does not output the DLL clocks RCLKDLL and FCLKDLL.

In addition, the output controller 30 also deactivates the output control signal EN in when the write drive signal WT12BWEN is activated, which makes the DLL not output the DLL clocks RCLKDLL and FCLKDLL.

However, the conventional DLL incurs unnecessary current consumption during an active stand-by current in non-power down mode, i.e., during an IDD3N mode, wherein the IDD3N mode is a state in which the bank is in active state before a read command is supplied thereto. The DLL clocks RCLKDLL and FCLKDLL are continuously and unnecessarily supplied because this state is not an idle state, even though the DLL clocks RCLKDLL and FCLKDLL are not required before the read command is supplied. In the IDD3N mode, current consumption occurs due to the continuous toggling of the clock and the operation of the power generator because a clock enable signal is being activated. Unnecessary current consumption also occurs in clock tree blocks, which receive the DLL clocks RCLKDLL and FCLKDLL as well.

SUMMARY OF THE INVENTION

It is, therefore, an object of the present invention to provide a semiconductor memory device having a delay locked loop (DLL) with lower power consumption.

In accordance with an aspect of the present invention, there is provided a semiconductor memory device including: a delay locked loop (DLL) for receiving an external clock to generate a DLL clock; an idle detector for detecting an idle state in which a command for driving a device is not supplied; and an output controller for controlling the output of the DLL based on the idle state, whether or not data is output.

In accordance with another aspect of the present invention, there is provided a semiconductor memory device including: a data section signal generator for generating a data section signal based on whether a data is output or not; and a DLL device for receiving an external clock to generate a DLL clock, and outputting the DLL clock in response to the data section signal in an idle state in which a command for driving a device is not supplied.

In accordance with another aspect of the present invention, there is provided a semiconductor memory device including: a data section signal generator for generating a data section signal by detecting whether data is output or not; and a DLL device for receiving an external clock to generate a delayed clock in consideration of an internal delay so that the delayed clock is outputted as a control-free DLL clock, and outputting the delayed clock as the DLL clock in response to the data section signal in an idle state in which a command for driving a device is not supplied.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor memory device having a delay locked loop (DLL) in accordance with exemplary embodiments of the present invention will be described in detail with reference to the accompanying drawings.

Figure 1:
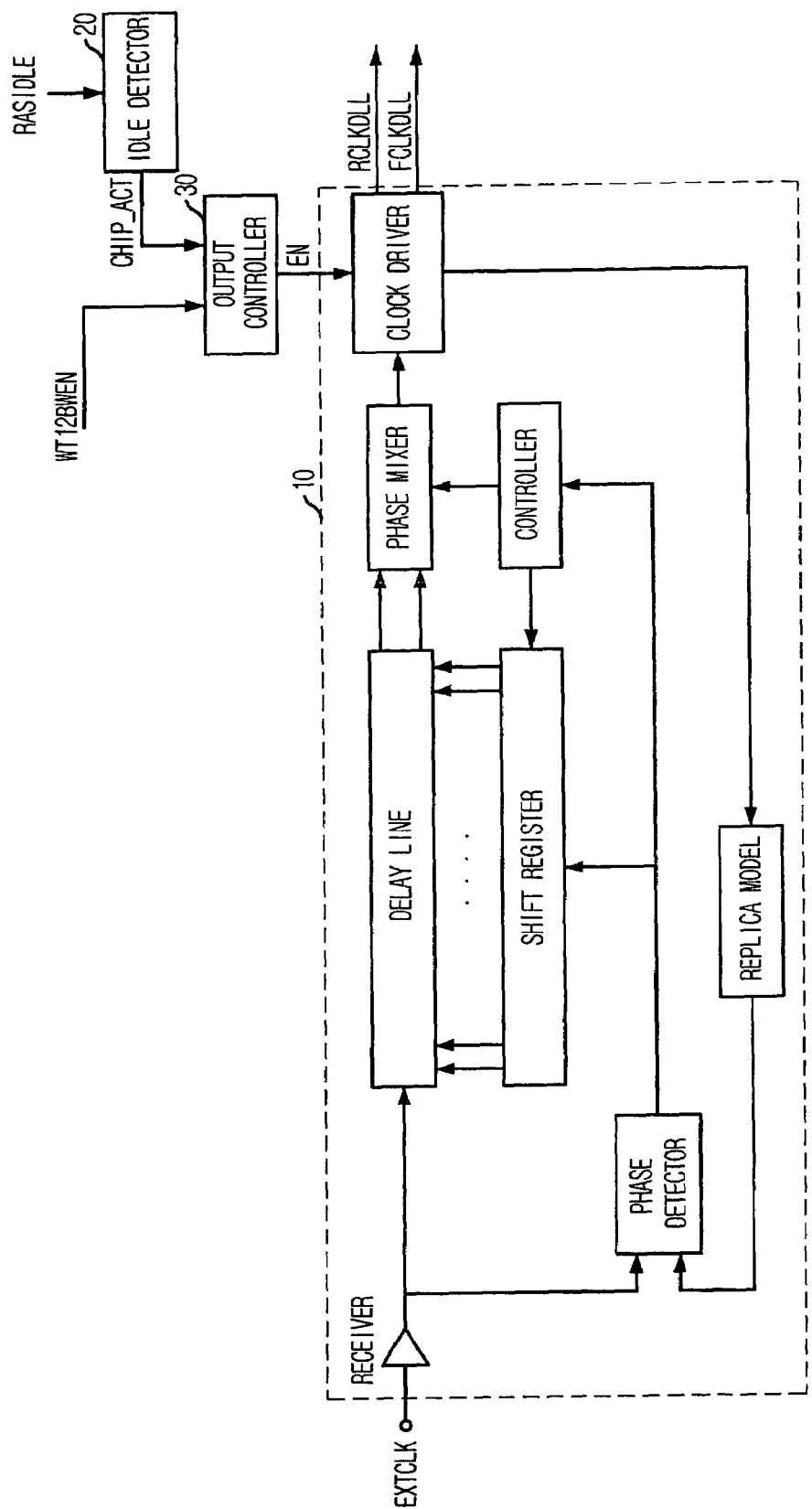
FIG. 1 is a block diagram of a conventional delay locked loop (DLL) device.
Figure 2:
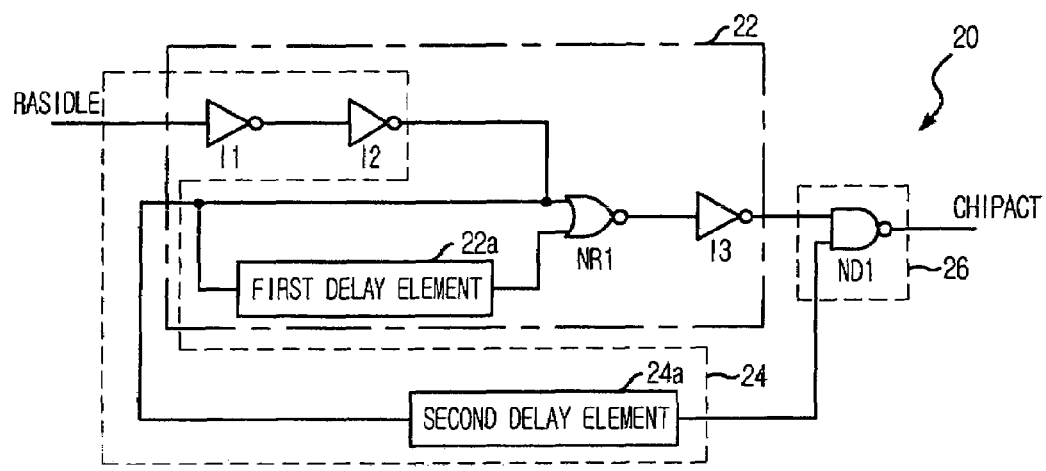
FIG. 2 is a circuit diagram setting forth the idle detector of FIG. 1.
Figure 3:
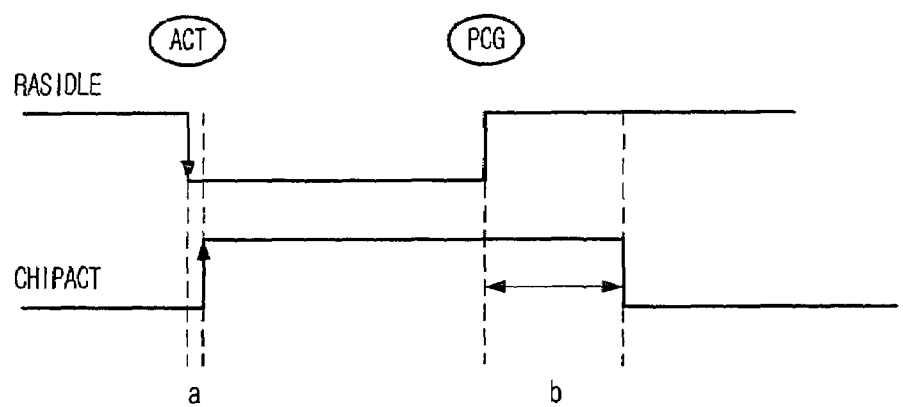
FIG. 3 is an operational waveform diagram illustrating the idle detector of FIG. 2.
Figure 4:
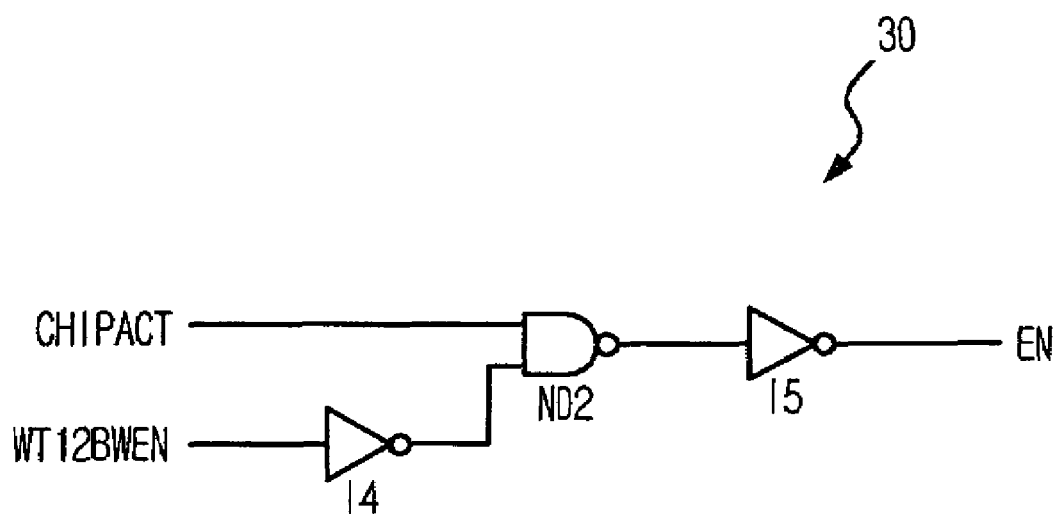
FIG. 4 is a circuit diagram setting forth the output controller of FIG. 3.
Figure 5:
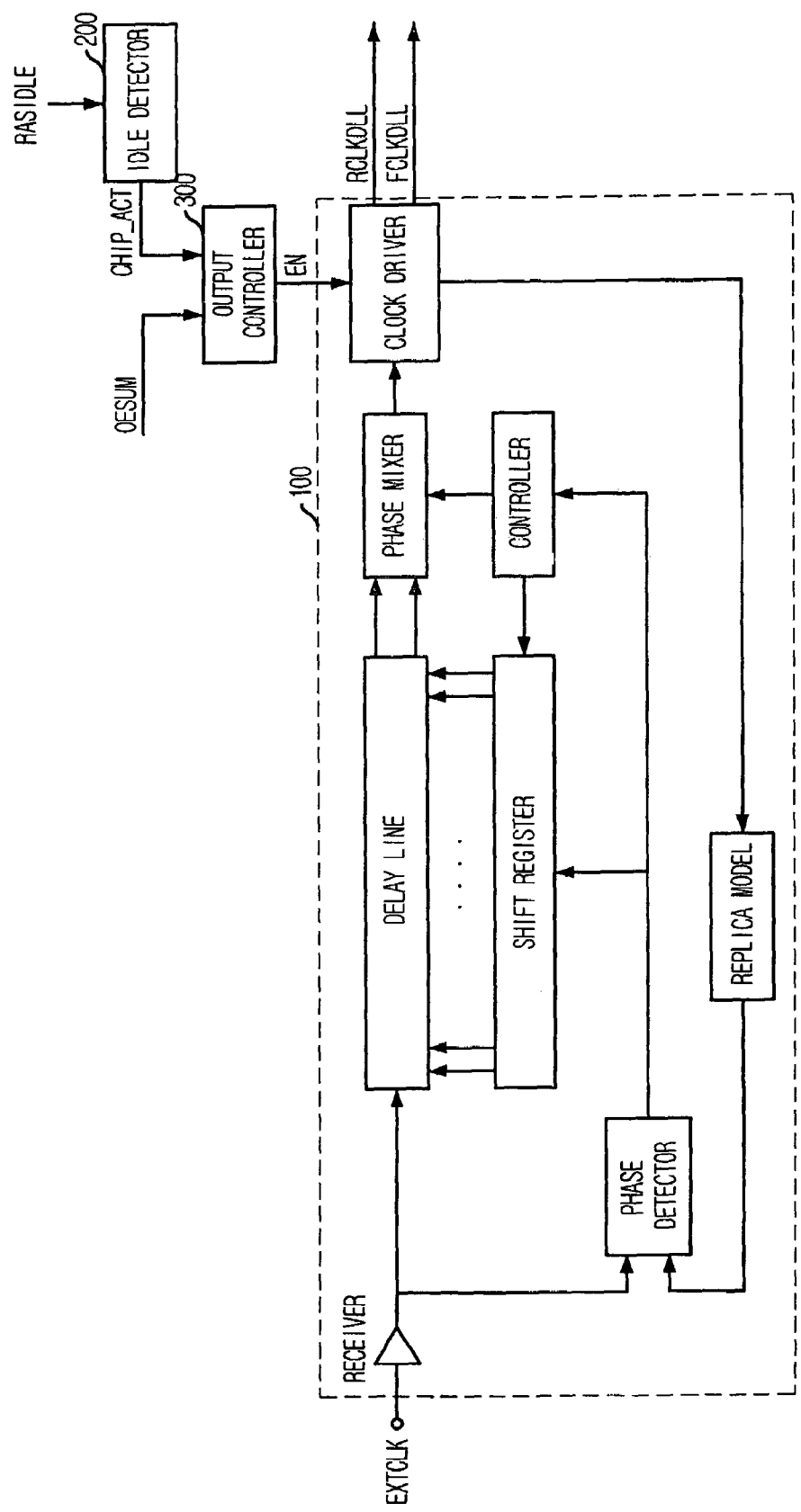
FIG. 5 is a block diagram of a DLL device in accordance with the present invention.

FIG. 5 is a black diagram of a DLL device in accordance with the present invention.

Referring to FIG. 5, the DLL device of the present invention includes a DLL 100 for receiving an external clock EXT-CLK to generate DLL clocks RCLKDLL and FCLKDLL, an idle state detector 200 for detecting an idle state, i.e., a precharge state of a memory bank in a semiconductor memory device, and an output controller 300 for controlling the output of the DLL 100 in case that the data is outputted in a non-idle state.

Figure 6:
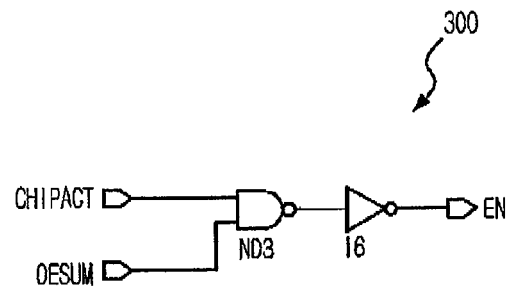
FIG. 6 is a circuit diagram setting forth an output controller of FIG. 5.

FIG. 6 is a circuit diagram setting forth the output controller 300 of FIG. 5. The output controller 300 is provided with a NAND gate ND3 for performing a logic NAND operation on a chip drive signal CHIPACT and a data section signal OSEUM, and an inverter I6 for inverting the output signal of the NAND gate ND3 to output an output control signal EN.

Considering an operation of the output controller 300, the output controller 300 activates the output control signal EN when the chip drive signal CHIPACT and the data section signal OESUM are activated.

That is, since the output controller 300 receives the data section signal OESUM activated while the data is output by a read command, the DLL clocks RCLKDLL and FCLKDLL are supplied only while the data is being output in the active operation of the device.

The data section signal OESUM is generated after receiving a plurality of output enable signals OE00 to OE60 which are used in generating a rising output control signal and a falling output control signal controlling the output timing of the data. This will be more fully set forth with reference to accompanying drawings later.

Figure 7:
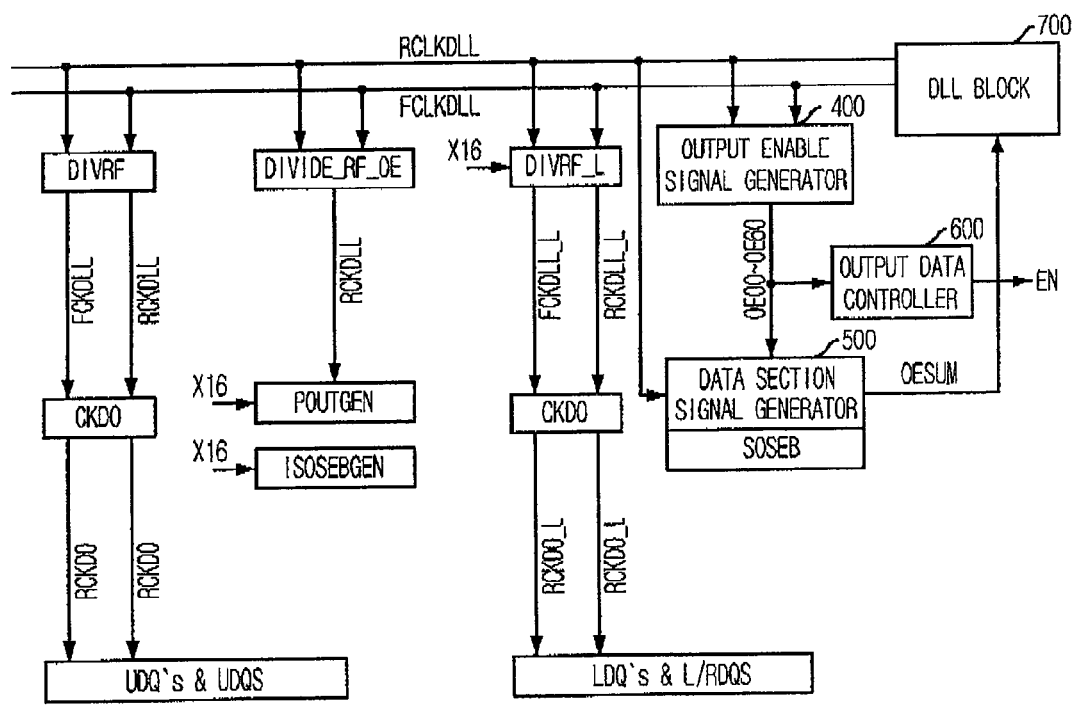
FIG. 7 is a block diagram setting forth a semiconductor memory device having the DLL device and clock tree block receiving DLL clocks of the DLL in accordance with a first embodiment of the present invention.

FIG. 7 is a block diagram setting forth a semiconductor memory device having a DLL device and clock tree block receiving DLL clocks of the DLL in accordance with a first embodiment of the present invention.

Referring to FIG. 7, a semiconductor memory device in accordance with the first embodiment includes a DLL block 700, an output enable signal generator 400, an output data controller 600 and a data section signal generator 500. The DLL block 700 receives the external clock EXTCLK to generate the DLL clocks RCLKDLL and FCLKDLL. The output enable signal generator 400 generates the plurality of output enable signals OE00 to OE60 which are sequentially activated in synchronization with the DLL clocks RCLKDLL and FCLKDLL when an internal read signal CASP6_RD is activated by the read command. The output data controller 600 generates the rising and falling output control signals EN for controlling the output timing of the data by means of a predetermined output enable signal corresponding to a preset latency among the plurality of output enable signals OE00 to OE60. The data section signal generator 500 receives the plurality of output enable signals OE00 to OE60 so as to generate the data section signal OESUM.

Figure 8:
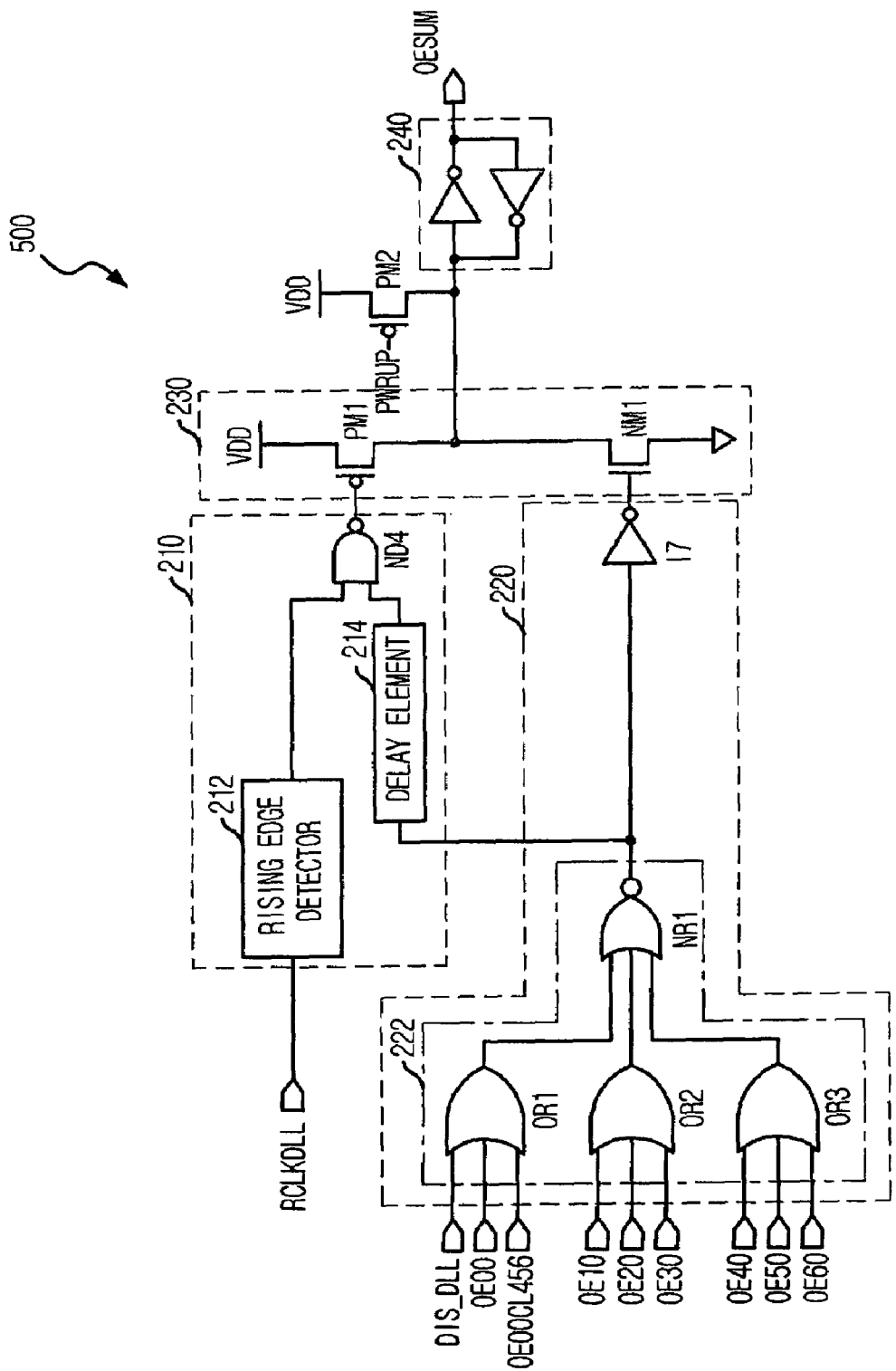
FIG. 8 is a circuit diagram illustrating a data section signal generator of FIG. 7.

FIG. 8 is a circuit diagram illustrating the data section signal generator 500 of FIG. 7.

Referring to FIG. 8, the data section signal generator 500 is configured with a signal input unit 210 and 220 for receiving the plurality of output enable signals OE00 to OE60 and the DLL clocks RCLKDLL, a driver 230 for driving an output node in response to the output signal of the signal input unit 210 and 220, an initializer PM2 for initializing the output node in response to a power up signal PWRUP, and a latch 240 for inverting and latching the voltage of the output node so as to output the data section signal OBSUM.

The signal input unit 210 and 220 is provided with a pull-down controller 220 for controlling the driver 230 to pull down the output node while the plurality of output enable signals OE00 to OE60 are activated, and a pull-up controller 210 for controlling the driver 230 to pull up the output node in response to the deactivation points of the plurality of output enable signals OE00 to OE60 and the rising DLL clock RCLKDLL.

The pull-down controller 220 has an activation detector 222 for detecting activation sections of the plurality of output enable signals OE00 to OE60 and the DLL drive signal DIS_DLL to thereby generate an activation section signal, and an inverter I7 for inverting the activation section signal to output it as a pull-down control signal.

The activation section detector 222 is configured with an OR gate OR1 for performing a logic OR operation on the output enable signals OE00 and OE00CL456 and the DLL drive signal DIS_DLL, an OR gate OR2 for performing the logic OR operation on the output enable signals OE10, OE20 and OE30, an OR gate OR3 for performing the logic OR operation on the output enable signals OE40, OE50 and OE60, and an NOR gate NR1 for performing a logic NOR operation on the output signals of the OR gates OR1, OR2 and OR3 so as to output the activation section signal.

The pull-up controller 210 is configured with a rising edge detector 212 for detecting a rising edge of the rising DLL clock RCLKDLL to generate a pulse signal, a delay element 214 for delaying the activation section signal, and a NAND gate ND4 for performing logic NAND operation on the output signals of the rising edge detector 212 and the delay element 214 so as to output the pull-up control signal.

The driver 230 is configured with a PMOS transistor PM1 receiving the pull-up control signal through a gate thereof and having a source-drain path between a supply terminal of an external power VDD and the output node, and an NMOS transistor NM1 receiving the pull-down control through a gate thereof and having a source-drain path between the output node and a supply terminal of a ground voltage VSS.

The initializer PM2 is configured with a PMOS transistor receiving the power-up signal PWRUP though a gate thereof and having a source-drain path between the supply terminal of the external power VDD and the output node.

For reference, the DLL drive signal DIS_DLL, which is a signal for outputting the DLL clocks RCLKDLL and FCLKDLL of the DLL 100 without any locking operation, is activated to logic high level.

Next, an operation of the data section signal generator 500 will be illustrated in brief.

When one of the plurality of output enable signals OE00 to OE60 or the DLL drive signal DIS_DLL is activated, the activation detector 222 detects this activation state to thereby activate the activation section signal to logic level high.

Therefore, the pull-down controller 220 activates the pull-down control signal to logic high level when the plurality of output enable signals OE00 to OE60 are activated.

Subsequently, the driver 230 pulls down the output node in response to the activation of the pull-down control signal. The latch 240 inverts and latches the voltage of the output node, to thereby activate the data section signal OESUM to logic high level.

When all of the plurality of output enable signals OE00 to OE60 are deactivated, the activation detector 222 detects this deactivation state so as to deactivate the activation section signal to logic high level.

Afterwards, the pull-up controller 210 activates the pull-up control signal to logic high level in synchronization with the rising DLL clock RCLKDLL after delaying the activation section signal by a predetermined delay time of the delay element 214. Furthermore, the pull-down controller 220 deactivates the pull-down control signal.

Accordingly, the driver 230 pulls up the output node in response to the activation of the pull-up control signal. The latch 240 inverts and latches the voltage of the output node, to thereby deactivate the data section signal OESUM to logic low level.

Therefore, the data section signal generator 500 activates the data section signal OESUM when one of the plurality of output enable signals OE00 to OE60 is activated, and deactivates the data section signal OESUM when all the output enable signals OE00 to OE60 are deactivated.

Figure 9:
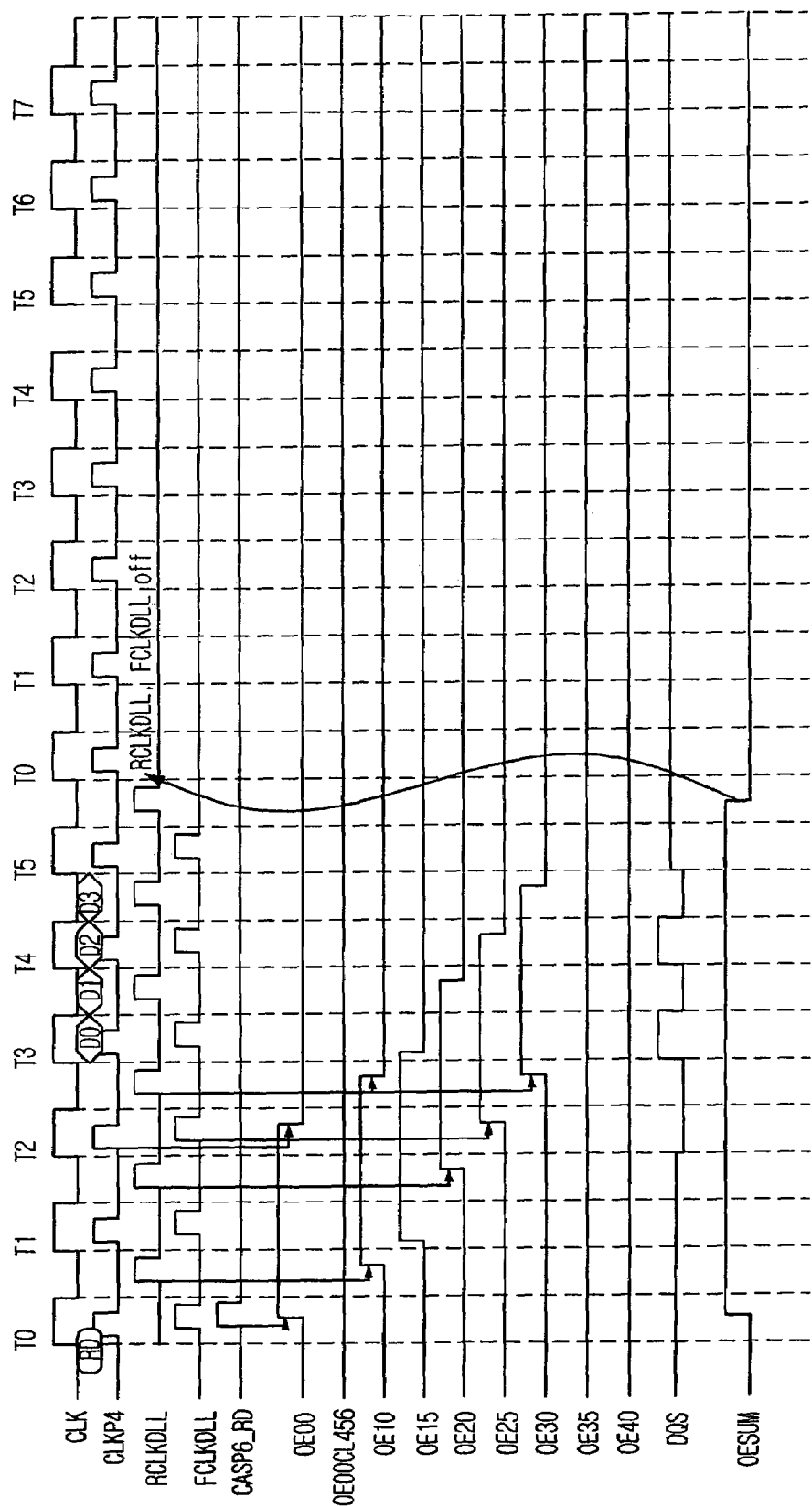
FIG. 9 is an operational waveform diagram of the semiconductor memory device in accordance with the first embodiment of the present invention.

FIG. 9 is an operational waveform diagram of the semiconductor memory device having the inventive DLL of FIGS. 5 to 8 and the clock tree block in accordance with the first embodiment of the present invention.

Referring to FIG. 9, when a read command RD is supplied, an internal read signal CASP6_RD is activated correspondingly.

The output enable signal generator 400 activates the output enable signal OE00 in response to the activation of the internal read signal CASP6_RD. At this time, the data section generator 500 activates the data section signal OESUM to logic high level in response to the activation of the output enable signal OE00.

Since the read command RD is a signal supplied after a bank active signal is supplied, the idle detector 200 activates the chip drive signal CHIPACT to logic high level before the read command is supplied, i.e., when the active command is supplied.

Accordingly, the output controller 300 activates the output control signal EN in response to the activations of the chip drive signal CHIPACT and the data section signal OESUM so that the DLL clock RCKDLL and FCLKDLL of the DLL 100 are outputted.

Subsequently, the output enable signal generator 400 generates the plurality of output enable signals OE10 to OE60 which are sequentially activated in synchronization with the DLL clocks RCLKDLL and FCLKDLL from the activation point of the output enable signal OE00.

Thereafter, when all the output enable signals OE10 to OE60 are deactivated, the data section signal generator 500 deactivates the data section signal OESUM correspondingly.

Thus, the output controller 300 deactivates the output control signal EN in response to the deactivation of the data section signal OESUM such that the DLL 100 does not output the DLL clocks FCLKDLL and RCLKDLL.

Therefore, since the semiconductor memory device including the inventive DLL device and the clock tree blocks detect whether or not the data is output by means of the plurality of output enable signals OE00 to OE60 which are activated in the activation of the internal read signal CASP6_RD, the inventive semiconductor can appropriately control the output of the DLL, i.e., the DLL clocks RCLKDLL and FCLKDLL. Accordingly, the semiconductor memory device of the present invention enables the clock tree blocks to be turned off in an IDD3N state before the read command is supplied and in an IDD4W sate when a write operation is performed although both theses states are non-idle state in which the active command is supplied, because the DLL clocks RCLKDLL and FCLKDLL are not supplied in the IDD3N state and IDD4W state. As a result, unnecessary current consumption is reduced in comparison with the prior art.

Figure 10:
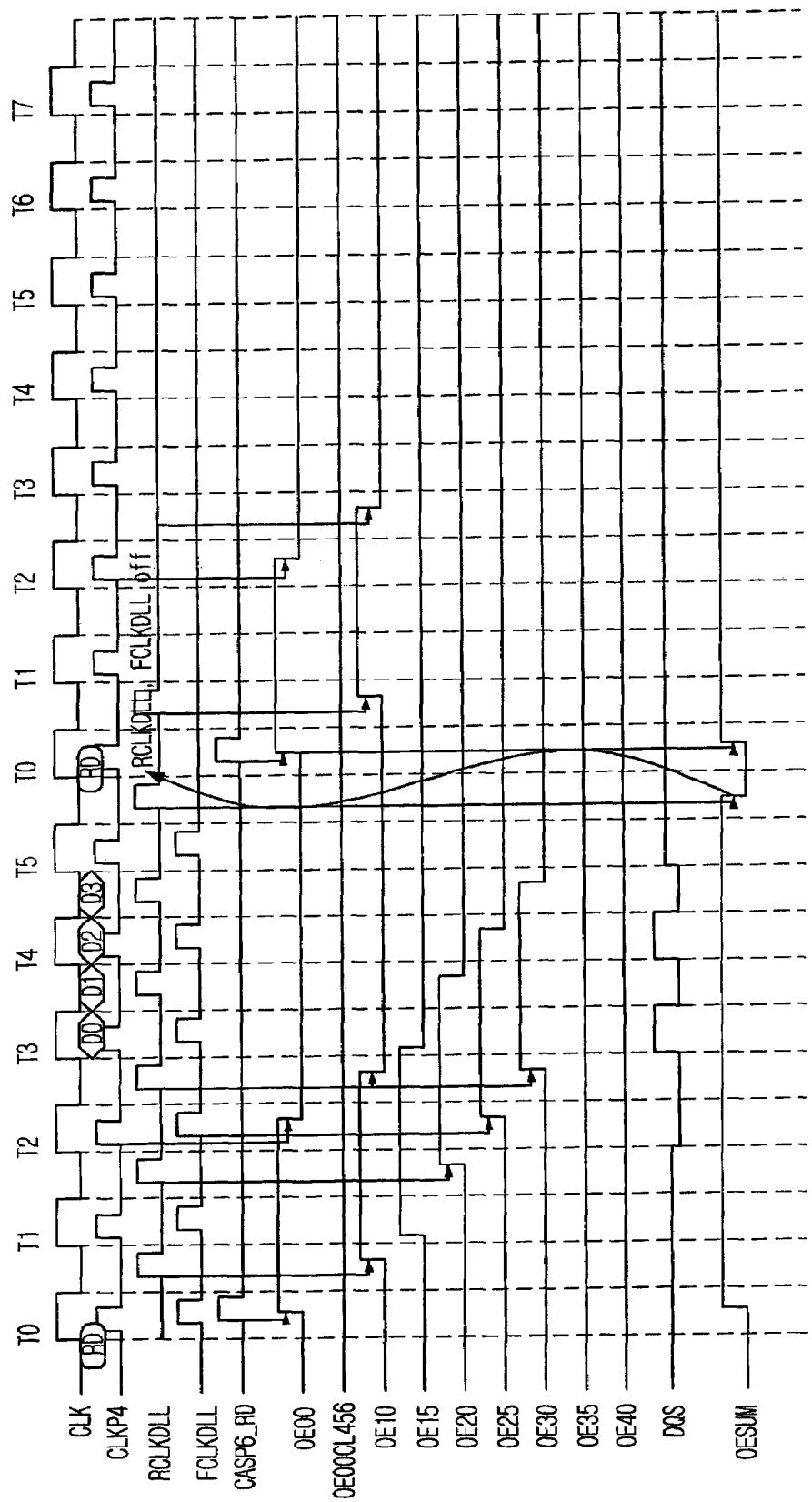
FIG. 10 is an operational waveform diagram illustrating operation of the semiconductor memory device at high frequency in accordance with the first embodiment of the present invention.

Errors may occur in driving the semiconductor memory device having the DLL device and the clock tree block at high frequency. FIG. 10 is an operational waveform diagram illustrating an erroneous operation of the semiconductor memory device having the inventive DLL and the clock tree blocks at high frequency in accordance with the first embodiment of the present invention.

Referring to FIG. 10, to begin with, when a first read command RD is supplied, the data section signal OESUM is activated. Thereafter, the plurality of output enable signals OE00 to OE60 are deactivated and the data section signal OESUM is deactivated.

Therefore, the DLL 100 does not output the DLL clocks RCLKDLL and FCLKDLL by means of the output controller 300.

Subsequently, a second read command RD is supplied so that the data section signal OESUM is activated again.

However, as the semiconductor memory device operates at higher and higher frequency, the activation point of the data section signal OESUM becomes close to the activation point of the output enable signal OE10 in synchronization with the rising DLL clock RCLKDLL.

In other words, the output enable signal OE00 is activated in synchronization with the activation of the internal read signal CASP6_RD. As a result, the data section signal OESUM is activated so that the DLL 100 supplies the DLL clocks RCLKDLL and FCLKDLL. Although the output enable signal OE10 should be activated in synchronization with the rising DLL clock RCLKDLL, the activation point of the data section signal OESUM may lag behind the activation point of the rising DLL clock required for generating the output enable signal OE10, when driving the device at high frequency. In this case, the plurality of output enable signals OE00 to OE60 activated in sequence have unnecessary delays, which cause a problem that the output data is not synchronized with the external clock EXTCLK.

To address this problem, control-free DLL clocks RCLKDLLOE and FCLKDLLOE, which are not controlled, are supplied to the output enable signal generator 400, which will be illustrated with reference to accompanying drawings.

Figure 11:
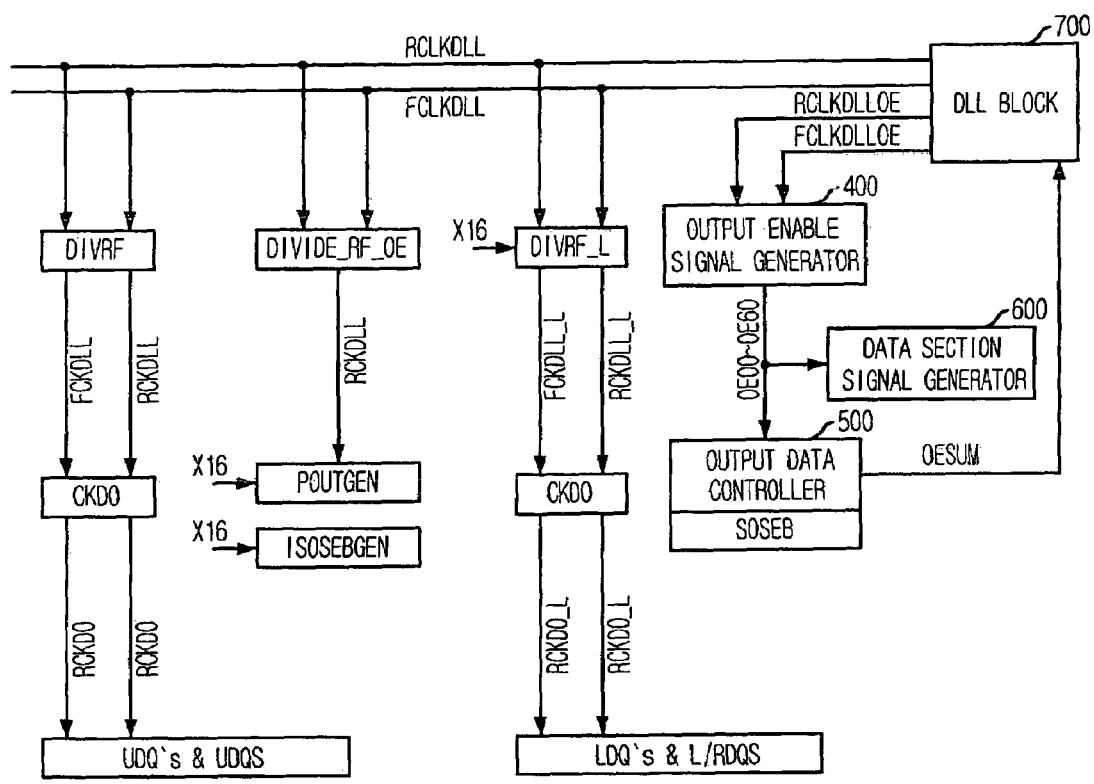
FIG. 11 is a block diagram of a semiconductor memory device having the DLL device and clock tree blocks for stably driving the device at high frequency in accordance with a second embodiment of the present invention.

FIG. 11 is a block diagram of a semiconductor memory device having the DLL device and clock tree block for driving the device at high frequency in accordance with a second embodiment of the present invention.

Referring to FIG. 11, the semiconductor memory device of the second embodiment includes a DLL block 700, an output enable signal generator 400, an output data controller 600 and a data section signal generator 500. The DLL block 700 outputs delayed clocks generated in consideration of an internal delay with respect to an external clock EXTCLK as DLL clocks RCLKDLL and FCLKDLL during an output period of the data. The DLL block 700 outputs the generated clocks as control-free DLL clocks RCLKDLLOE and FCLKDLLOE without any control. The output enable signal generator 400 generates the plurality of output enable signals OE00 to OE60 which are sequentially activated in synchronization with the control-free DLL clocks RCLKDLLOE and FCLKDLLOE when an internal read signal CASP6_RD is activated by a read command. The output data controller 600 receives the plurality of output enable signals OE00 to OE60 to control the output timing of the data. The data section signal generator 500 receives the plurality of output enable signals OE00 to OE60 so as to generate the data section signal OESUM.

The semiconductor memory device of the second embodiment outputs the DLL clocks RCLKDLL and FCLKDLL by the control of the data section signal OESUM, and always outputs the control-free DLL clocks RCLKDLLOE and FCLKDLLOE without any control. The output enable signal generator 400 receives the control-free DLL clocks RCLKDLLOE and FCLKDLLOE such that it is driven thereby.

Therefore, since the output enable signal generator 400 is driven by the control-free DLL clocks RCLKDLLOE and FCLKDLLOE which are always outputted regardless of conditions, it is possible to prevent the DLL clocks RCLKDLL and FCLKDLL from being delayed in case that the read command is successively inputted under the state the DLL clocks RCLKDLL and FCLKDLL are not outputted at high frequency.

Figure 12:
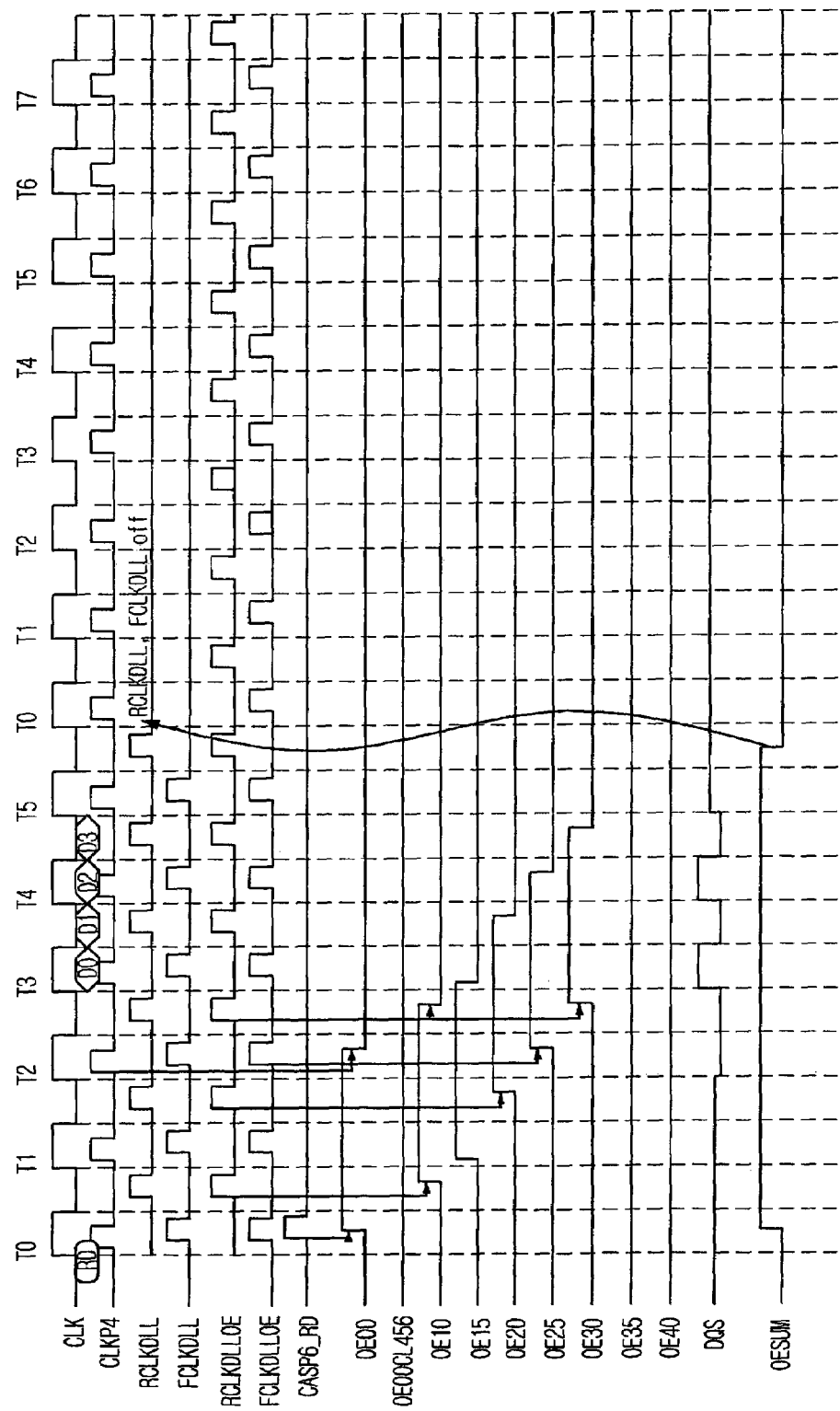
FIG. 12 is an operational waveform diagram illustrating operation of the semiconductor memory device in accordance with the second embodiment of the present invention.

FIG. 12 is an operational waveform diagram illustrating an operation of the semiconductor memory device in accordance with the second embodiment of the present invention.

Referring to FIG. 12, when the read command is supplied, the internal read signal CASP6_RD is activated correspondingly.

The output enable signal generator 400 activates the plurality of output enable signals OE00 to OE60 in synchronization with the control-free DLL clocks RCLKDLLOE and FCLKDLLOE from the activation point of the internal read signal CASP6_RD.

Thereafter, the data section generator 500 activates the data section signal OESUM to logic high level in response to the plurality of output enable signals OE00 to OE60.

Since a read command RD is a signal supplied after a bank active signal is supplied, the idle detector 200 activates the chip drive signal CHIPACT to logic high level before the read command is supplied, i.e., when the active command is supplied.

Accordingly, the output controller 300 activates the output control signal EN in response to the activation of the chip drive signal CHIPACT and the data section signal OESUM so that the DLL clock RCKDLL and FCLKDLL of the DLL 100 are output.

Thereafter, when all the output enable signals OE00 to OE60 are deactivated, the data section signal generator 500 deactivates the data section signal OESUM correspondingly.

Thus, the output controller 300 deactivates the output control signal EN in response to the deactivation of the data section signal OESUM such that the DLL 100 does not output the DLL clocks FCLKDLL and RCLKDLL.

Therefore, in accordance with the second embodiment of the present invention, since the semiconductor memory device including the DLL device and the clock tree block generates a plurality of output enable signals OE00 to OE60 using the control-free DLL clocks RCLKDLLOE and FCLKDLLOE, it is possible to prevent erroneous operation at high frequency because there is no occasion that the DLL clocks RCLKDLL and FCLKDLL are not generated due to the activation point of the data section signal OESUM.

In addition, the semiconductor of the second embodiment can also reduce power consumption in comparison with the prior art because the DLL clock is not supplied in a non-idle state when the active command is supplied, i.e., in an IDD3N state before the read command is supplied and in an IDD4W sate when a write operation is performed.

As described above, in accordance with the present invention, since the DLL is turned off only during the period that the data is output by the read command, the clock tree blocks receiving the DLL clock are also turned off, which results in reducing unnecessary current consumption.

The present application contains subject matter related to the Korean patent applications Nos. KR 2005-0090861 and KR 2005-0134013, filed in the Korean Patent Office on Sep. 28, 2005 and Dec. 29, 2005 respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
   a delay locked loop (DLL) for receiving an external clock to generate a DLL clock;
   an idle detector for detecting an idle state in which a command for driving a device is not supplied; and
   an output controller for controlling the output of the DLL based on the idle state, whether or not data is output,
   wherein the output controller enables the DLL clock to be output only when a data output command signal is activated and a chip drive signal output from the idle detector is activated.

2. The semiconductor memory device as recited in claim 1, wherein the output controller includes:
   a first NAND gate for performing a logic NAND operation on the chip drive signal and the data section signal; and
   a first inverter for inverting the output signal of the first NAND gate to output an output control signal for controlling the DLL clock of the delay locked loop.

3. The semiconductor memory device as recited in claim 2, wherein the idle detector activates the chip drive signal upon a first delay time after an idle state signal is deactivated, and deactivates the chip drive signal upon a second delay time after the idle state signal is activated, the idle state signal being activated when the command is supplied and deactivated when a precharge command is supplied.

4. The semiconductor memory device as recited in claim 3, wherein the idle detector includes:
   a first delay unit for delaying the idle state signal by the first delay time when the idle state signal is deactivated;
   a second delay unit for delaying the idle state signal by the second delay time when the idle state signal is activated; and
   a signal generator for generating a chip drive signal in response to the output signals of the first and second delay units.

5. The semiconductor memory device as recited in claim 4, wherein the first delay unit includes:
   a second inverter and a third inverter for delaying the idle state signal and transferring the delayed idle state signal;
   a first delay element for delaying the output signal of the third inverter by the first delay time;
   a NOR gate for performing a logic NOR operation on the output signal of the third inverter and the output signal of the first delay element; and
   a fourth inverter for inverting the output signal of the NOR gate.

6. The semiconductor memory device as recited in claim 5, wherein the second delay unit includes:
   a fifth inverter and a sixth inverter for delaying the idle state signal; and
   a second delay element for delaying the output signal of the sixth inverter by the second delay time.

7. The semiconductor memory device as recited in claim 6, wherein the signal generator includes a second NAND gate for performing a logic NAND operation on the outputs of the first and second delay units to output the chip drive signal.

8. A semiconductor memory device, comprising:
   a data section signal generator for generating a data section signal based on whether a data is output or not; and
   a DLL device for receiving an external clock to generate a DLL clock, and outputting the DLL clock in response to the data section signal in an idle state in which a command for driving a device is not supplied,
   wherein the data section signal generator activates the data section signal when a plurality of output enable signals are activated, the plurality of output enable signals being generated for controlling an output timing of the data.

9. The semiconductor memory device as recited in claim 8, wherein the DLL device includes:
   an idle detector for detecting the idle state;
   an output controller for receiving the output signal of the idle detector and the data section signal to generate an output enable signal; and
   a DLL for receiving an external clock to generate the DLL clock, and outputting the DLL clock only while the output enable signal is activated.

10. The semiconductor memory device as recited in claim 9, further comprising an output enable signal generator, wherein the output enable signal generator generates a first output enable signal in synchronization with an activation of an internal read signal which enables a read operation to perform, and sequentially activates a second to an Nth output enable signals in synchronization with the DLL clock from the activation point of the first output enable signal.

11. The semiconductor memory device as recited in claim 10, wherein the data section signal generator includes:
   a signal input unit for receiving the first to the Nth output enable signals and the DLL clock;
   a driver for driving an output node in response to the output signal of the signal input unit; and
   a latch for latching a voltage of the output node and outputting it as the data section signal.

12. The semiconductor memory device as recited in claim 11, wherein the signal input unit includes:
   a pull-down controller for controlling the driver such that it pulls down the output node while the first to the Nth output enable signals are activated; and
   a pull-up controller for controlling the driver such that it pulls up the output node in response to the deactivations of the first to the Nth output enable signals and the DLL clock.

13. The semiconductor memory device as recited in claim 12, wherein the pull-down controller includes:
   an activation detector for detecting whether or not the first to the Nth output enable signals and a DLL drive signal are activated, and generating an activation section signal; and a first inverter for inverting the activation section signal to output a pull-down control signal.

14. The semiconductor memory device as recited in claim 13, wherein the activation detector includes:
a first OR gate for performing a logic OR operation on the first to the Lth output enable signals and the DLL drive signal;
a second OR gate for performing a logic OR operation on the L+1th to the Mth output enable signals;
a third OR gate for performing a logic OR operation on the M+1th to the Nth output enable signals; and
a first NOR gate for performing a logic NOR operation on the outputs of the first to the third OR gates to output the activation section signal.

15. The semiconductor memory device as recited in claim 14, wherein the pull-up controller includes:
a rising edge detector for detecting a rising edge of the DLL clock to generate a pulse signal;
a first delay element for delaying the activation section signal; and
a first NAND gate for performing a logic NAND operation on the output signals of the rising edge detector and the first delay element to output a pull-up control signal.

16. The semiconductor memory device as recited in claim 15, wherein the driver includes:
a first PMOS transistor receiving the pull-up control signal through a gate thereof, and having a source-drain path between a supply terminal of an external power and the output node; and
an NMOS transistor receiving the pull-down control through a gate thereof, and having a source-drain path between the output node and a ground terminal.

17. The semiconductor memory device as recited in claim 16, wherein the data section signal generator further includes an initializer for initializing the output node in response to a power-up signal which is activated when initially driving the device.

18. The semiconductor memory device as recited in claim 17, wherein the initializer includes a second PMOS transistor receiving the power-up signal through a gate thereof, and having a source-drain path between the supply terminal of the external power and the output node.

19. The semiconductor memory device as recited in claim 18, wherein the output controller activates the output control signal if the chip drive signal of the idle detector and the data section signal are activated, but otherwise the output controller deactivates the output control signal.

20. The semiconductor memory device as recited in claim 19, wherein the output controller includes:
a second NAND gate for performing a logic NAND operation on the chip drive signal and the data section signal; and
a second inverter for inverting the output signal of the second NAND gate to output it as the output control signal.

21. The semiconductor memory device as recited in claim 20, wherein the idle detector activates the chip drive signal in a first delay time later after the idle state signal is deactivated, and deactivates the chip drive signal in a second delay time later after the idle state signal is activated, the idle state signal being activated when the command is supplied and deactivated when a precharge command is supplied.

22. The semiconductor memory device as recited in claim 21, wherein the idle detector includes:
a first delay unit for delaying the idle state signal by the first delay time when the idles state signal is deactivated;
a second delay unit for delaying the idle state signal by the second delay time when the idle state signal is activated; and
a signal generator for generating the chip drive signal in response to the output signals of the first and second delay units.

23. The semiconductor memory device as recited in claim 22, wherein the first delay unit includes:
a third inverter and a fourth inverter for delaying the idle state signal and transferring the delayed idle state signal;
a second delay element for delaying the output signal of the fourth inverter by the first delay time;
a second NOR gate for performing a logic NOR operation on the output signal of the fourth inverter and the output signal of the second delay element; and
a fifth inverter for inverting the output signal of the second NOR gate.

24. The semiconductor memory device as recited in claim 23, wherein the second delay unit includes:
a sixth inverter and a seventh inverter for delaying the idle state signal; and
a third delay element for delaying the output signal of the seventh inverter by the second delay time.

25. The semiconductor memory device as recited in claim 24, wherein the signal generator includes a third NAND gate for performing a logic NAND operation on the outputs of the first and second delay units to output the chip drive signal.

26. The semiconductor memory device as recited in claim 9, wherein the output controller activates the output control signal if the chip drive signal of the idle detector and the data section signal are activated, but otherwise the output controller deactivates the output control signal.

27. The semiconductor memory device as recited in claim 26, wherein the output controller includes:
a first NAND gate for performing a logic NAND operation on the chip drive signal and the data section signal; and
a first inverter for inverting the output signal of the first NAND gate to output it as the output control signal.

28. The semiconductor memory device as recited in claim 27, wherein the idle detector activates the chip drive signal in a first delay time later after the idle state signal is deactivated, and deactivates the chip drive signal in a second delay time later after the idle state signal is activated, the idle state signal being activated when the command is supplied and deactivated when a precharge command is supplied.

29. The semiconductor memory device as recited in claim 28, wherein the idle detector includes:
a first delay unit for delaying the idle state signal by the first delay time when the idles state signal is deactivated;
a second delay unit for delaying the idle state signal by the second delay time when the idle state signal is activated; and
a signal generator for generating the chip drive signal in response to the output signals of the first and second delay units.

30. The semiconductor memory device as recited in claim 29, wherein the first delay unit includes:
a second inverter and a third inverter for delaying the idle state signal and transferring the delayed idle state signal;
a first delay element for delaying the output signal of the third inverter by the first delay time;
a NOR gate for performing a logic NOR operation on the output signal of the third inverter and the output signal of the first delay element; and
a fourth inverter for inverting the output signal of the NOR gate and outputting it.

31. The semiconductor memory device as recited in claim 30, wherein the second delay unit includes:
a fifth inverter and a sixth inverter for delaying the idle state signal; and
a second delay element for delaying the output signal of the sixth inverter by the second delay time.

32. The semiconductor memory device as recited in claim 31, wherein the signal generator includes a second NAND gate for performing a logic NAND operation on the outputs of the first and second delay units to output the chip drive signal.

33. A semiconductor memory device, comprising:
a data section signal generator for generating a data section signal by detecting whether data is output or not; and
a DLL device for receiving an external clock to generate a delayed clock in consideration of an internal delay so that the delayed clock is outputted as a control-free DLL clock, and outputting the delayed clock as the DLL clock in response to the data section signal in an idle state in which a command for driving a device is not supplied,
wherein the semiconductor memory device further comprises, for generating an output enable signal generator for generating a first output enable signal in synchronization with an activation of an internal read signal which enables a read operation to perform, and for sequentially activating a second to an Nth output enable signals in synchronization with the control-free DLL clock from the activation point of the first output enable signal.

34. The semiconductor memory device as recited in claim 33, wherein the DLL device includes:
an idle detector for detecting the idle state;
an output controller for receiving the output signal of the idle detector and the data section signal to generate an output enable signal; and
a DLL for receiving an external clock to generate the DLL clock, and outputting the DLL clock only while the output enable signal is activated.

35. The semiconductor memory device as recited in claim 34, wherein the data section signal generator comprises:
a signal input unit for receiving the first to the Nth output enable signals and the DLL clock;
a driver for driving an output node in response to the output signal of the signal input unit; and
a latch for latching a voltage of the output node and outputting it as the data section signal.

36. The semiconductor memory device as recited in claim 35, wherein the signal input unit includes:
a pull-down controller for controlling the driver such that it pulls down the output node when the first to the Nth output enable signals are activated; and
a pull-up controller for controlling the driver such that it pulls up the output node in response to the deactivations of the first to the Nth output enable signals and the DLL clock.

37. The semiconductor memory device as recited in claim 36, wherein the pull-down controller includes:
an activation detector for detecting whether or not the first to the Nth output enable signals and a DLL drive signal are activated, and generating an activation section signal; and
a first inverter for inverting the activation section signal to output a pull-down control signal.

38. The semiconductor memory device as recited in claim 37, wherein the activation detector includes:
a first OR gate for performing a logic OR operation on the first to the Lth output enable signals and the DLL drive signal;
a second OR gate for performing a logic OR operation on the L+1th to the Mth output enable signals;
a third OR gate for performing a lock OR operation on the M+1th to the Nth output enable signals; and
a first NOR gate for performing a logic NOR operation on the outputs of the first to the third OR gates to output the activation section signal.

39. The semiconductor memory device as recited in claim 38, wherein the pull-up controller includes:
a rising edge detector for detecting a rising edge of the DLL clock to generate a pulse signal;
a first delay element for delaying the activation section signal; and
a first NAND gate for performing a logic NAND operation on the output signals of the rising edge detector and the first delay element to output a pull-up control signal.

40. The semiconductor memory device as recited in claim 39, wherein the driver includes:
a first PMOS transistor receiving the pull-up control signal through a gate thereof, and having a source-drain path between a supply terminal of an external power and the output node; and
an NMOS transistor receiving the pull-down control through a gate thereof, and having a source-drain path between the output node and a ground terminal.

41. The semiconductor memory device as recited in claim 40, wherein the data section signal generator further includes an initializer for initializing the output node in response to a power-up signal which is activated when initially driving the device.

42. The semiconductor memory device as recited in claim 41, wherein the initializer includes a second PMOS transistor receiving the power-up signal through a gate thereof, and having a source-drain path between the supply terminal of the external power and the output node.

43. The semiconductor memory device as recited in claim 34, wherein the output controller activates the output control signal if the chip drive signal of the idle detector and the data section signal are activated, but otherwise the output controller deactivates the output control signal.

44. The semiconductor memory device as recited in claim 35, wherein the output controller activates the output control signal if the chip drive signal of the idle detector and the data section signal are activated, but otherwise the output controller deactivates the output control signal.

45. The semiconductor memory device as recited in claim 44, wherein the output controller includes:
a first NAND gate for performing a logic NAND operation on the chip drive signal and the data section signal; and
a first inverter for inverting the output signal of the first NAND gate to output it as the output control signal.

46. The semiconductor memory device as recited in claim 45, wherein the idle detector activates the chip drive signal in a first delay time later after an idle state signal is deactivated, and deactivates the chip drive signal in a second delay time later after the idle state signal is activated, the idle state signal being activated when the command is supplied and deactivated when a precharge command is supplied.

47. The semiconductor memory device as recited in claim 46, wherein the idle detector includes:
a first delay unit for delaying the idle state signal by the first delay time when the idles state signal is deactivated;
a second delay unit for delaying the idle state signal by the second delay time when the idle state signal is activated; and a signal generator for generating the chip drive signal in response to the output signals of the first and second delay units.

48. The semiconductor memory device as recited in claim 47, wherein the first delay unit includes:
a second inverter and a third inverter for delaying the idle state signal and transferring the delayed idle state signal;
a first delay element for delaying the output signal of the third inverter by the first delay time;
a NOR gate for performing a logic NOR operation on the output signal of the third inverter and the output signal of the first delay element; and
a fourth inverter for inverting the output signal of the NOR gate.

49. The semiconductor memory device as recited in claim 48, wherein the second delay unit includes:
a fifth inverter and a sixth inverter for delaying the idle state signal; and
a second delay element for delaying the output signal of the sixth inverter by the second delay time.

50. The semiconductor memory device as recited in claim 49, wherein the signal generator includes a second NAND gate for performing a logic NAND operation on the outputs of the first and second delay units to output the chip drive signal.

* * * * *